(12) United States Patent
Moulding et al.

(10) Patent No.: US 6,445,034 B1
(45) Date of Patent: Sep. 3, 2002

(54) MOS TRANSISTOR HAVING FIRST AND SECOND CHANNEL SEGMENTS WITH DIFFERENT WIDTHS AND LENGTHS

(75) Inventors: Kenneth W. Moulding, Horley; John B. Hughes, Hove, both of (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 553 days.

(21) Appl. No.: 08/753,556

(22) Filed: Nov. 26, 1996

(30) Foreign Application Priority Data

Nov. 28, 1995 (GB) ............................................... 9524334

(51) Int. Cl.⁷ ............................................... H01L 29/76
(52) U.S. Cl. ....................................... 257/327; 257/286
(58) Field of Search ............................. 257/327, 286, 257/287, 270, 266, 315, 318

(56) References Cited

U.S. PATENT DOCUMENTS 5,362,988 A   11/1994   Hellums ..................... 327/543

FOREIGN PATENT DOCUMENTS

| JP | 54-46556 A | * | 4/1981 |
| JP | 62-5668 A | * | 1/1987 |
| JP | 62-14779 A | * | 7/1987 |
| JP | 1-243591 A | * | 9/1989 |
| JP | 2-156672 A | * | 6/1990 |

OTHER PUBLICATIONS

Runyan et al., Semiconductor Integrated Circuit Processing Technology, pp. 40–41 and 162, 1990.*
"CMOS Analog Circuit Design", by P.E. Allen et al, pp. 231–232.

* cited by examiner

Primary Examiner—Sara Crane
(74) Attorney, Agent, or Firm—Aaron Waxler

(57) ABSTRACT

In order to enable non-integer current ratios to be produced in current mirror circuits using small transistors the channel area is adjusted by changes in the channel length over part of the width of the channel. In further embodiments the transistor is formed as two or more sub-transistors, the channel length of one sub-transistor being unequal to that of the other(s).

Figure 1:
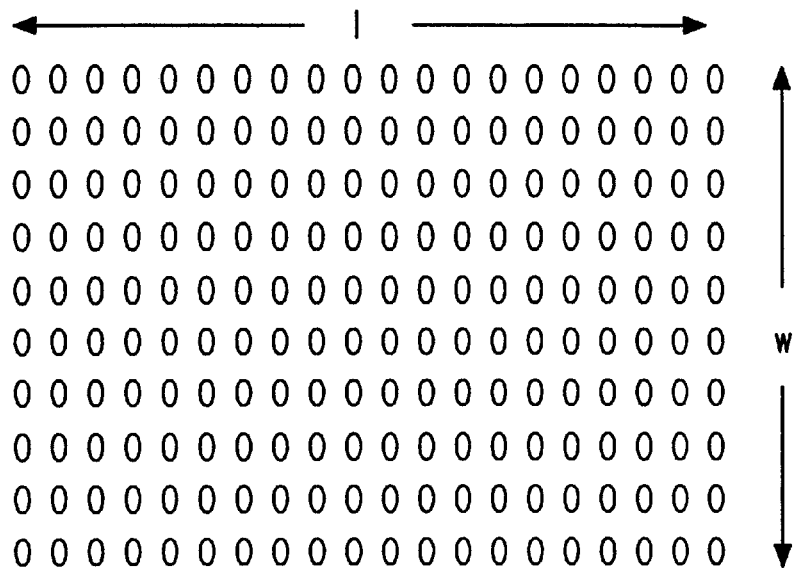

4 Claims, 2 Drawing Sheets

MOS TRANSISTOR HAVING FIRST AND SECOND CHANNEL SEGMENTS WITH DIFFERENT WIDTHS AND LENGTHS

The invention relates to an MOS transistor and more particularly to the achievement of desired channel dimensions.

One application of MOS transistors is in the fabrication of current mirror circuits which in its basic form comprise two transistors one of which is diode connected and has the input current applied to it and the other of which has its gate and source electrodes connected to the gate and source electrodes, respectively, of the first transistor and produces an output current at its drain electrode which is related to the input current. The relationship between the input and output currents depends on the channel width/length quotients of the transistors. In order to obtain an accurate ratio between the input and output currents it is normal to use a common channel length and vary only the channel width to obtain the desired current ratio because the relationship between the current and channel width is more linear than the relationship between current and channel length. Transistor dimensions, however, normally have to fit a resolution grid which means there is a minimum step between the possible channel widths available. Consequently there is a limit to the current ratios available, that is integer ratios may be obtained relatively easily but fractional ratios may be difficult to achieve with accuracy.

U.S. Pat. No. 5,362,988 discloses a mid rail generator circuit which uses a number of current mirror circuits. In this document all the channel lengths are kept the same and the channel widths are varied to produce the desired current ratios. In addition in order to obtain an integer multiplication a number of identical transistors are connected in parallel. While these arrangements are adequate to produce integer or simple fractional current ratios they become unwieldy for producing accurate non simple ratios unless transistor sizes are large.

The text book entitled "CMOS Analogue Circuit Design" by Philip E. Allen and Douglas R. Holberg, published by Holt, Rinehart and Winston Inc. (ISBN 0-03-006587-9) at pages 231 and 232 discusses the dimensioning of transistors in current amplifiers but is primarily concerned with integer multiplying factors. It states that it is usual to scale the channel widths rather than the channel length because the length tolerances are greater than the width tolerances due to out diffusion under the polysilicon gate.

It is an object of the invention to enable the construction of transistors having effective width to length ratios which can be defined in small increments without requiring large transistor sizes. It is a further object of the invention to enable the construction of current mirror circuits having non-integer current ratios using relatively small sized transistors.

The invention provides an MOS transistor in which the channel length and channel width are multiples of a minimum isolation grid unit characterised in that the channel length is greater for a portion of the width units than for the remainder of the width units.

By altering the length for some of the width units only a finer control of the transistor current for a given gate-source potential can be achieved and consequently a greater choice of current ratios in current mirror circuits constructed from such transistors can be obtained. It has been discovered that since the length is normally only altered by a small percentage of the overall length the less linear variation of current with channel length is not significant.

Figure 2:
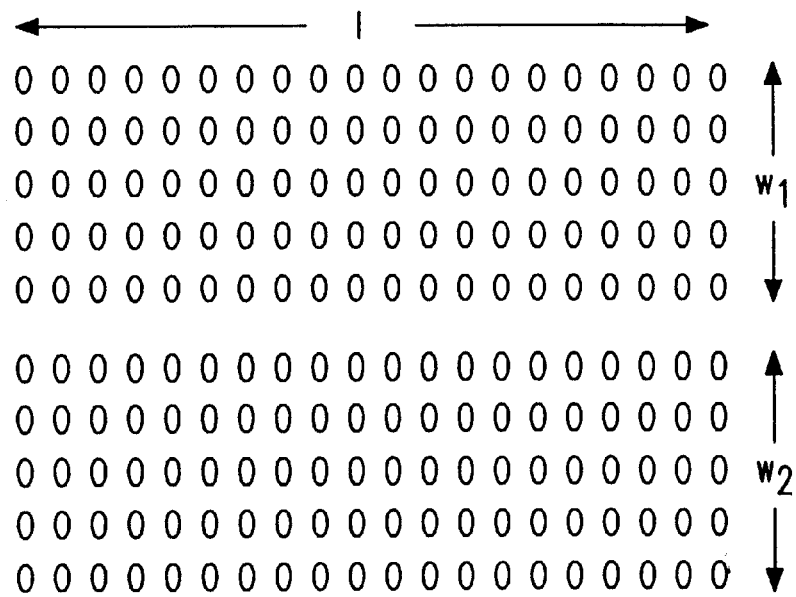
Figure 3:
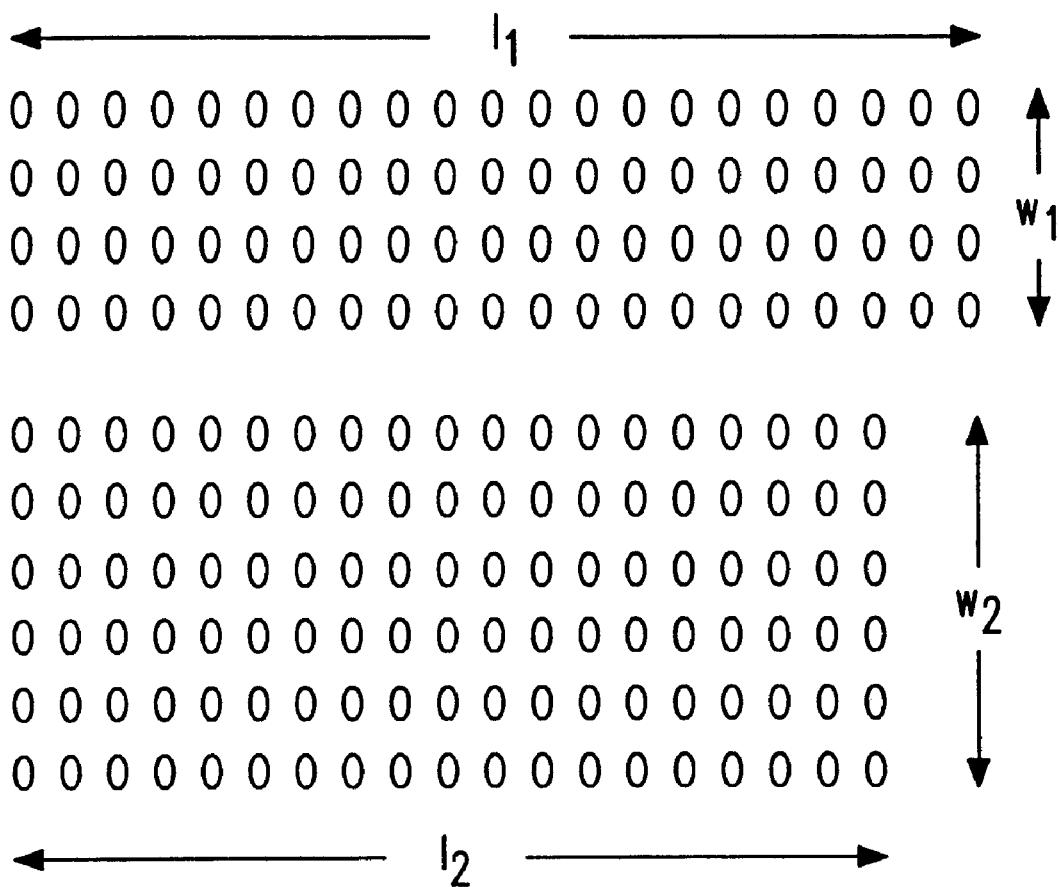

Embodiments of the invention will now be described, by way of example, with reference to the accompanying drawings in which FIG. 1 shows a first resolution grid for the channel of an MOS transistor FIG. 2 shows a second resolution grid whereby the transistor is split into two narrower segments connected in parallel, and FIG. 3 shows a third resolution grid whereby each segment has a different length.

When using switched current techniques to fabricate filters it is often necessary to produce accurate current ratios which are non-integer values and to use small transistors in current mirror circuits to minimise circuit area. When using small transistors, however, there are limits to the precision of the changes in current ratio which can be achieved. This can be seen from a consideration FIG. 1. In FIG. 1 a resolution grid is shown where the transistor channel is represented as twenty grid units in length (l) and ten grid units in width (w). If it is desired to construct a current mirror circuit having a given current ratio using a further transistor using the same resolution grid and having the same channel length then the minimum change in width is one resolution unit, i.e. 10% of the width. Consequently the current ratio can only be selected in 10% steps. Such a limitation in current ratios is not acceptable for switched current circuits which frequently require non-integer current ratios defined more precisely than in 10% steps. Clearly this problem could be overcome by increasing the overall size of the transistors, but this is not a desirable solution as there is a trend towards smaller device sizes to minimise chip area. An alternative approach is to reduce (or increase) the channel length by one gird resolution unit. This gives a 5% step in this example and provided that the percentage difference in the channel lengths is small the advantages resulting from having a common channel length are not significantly affected. These advantages are that the relationship between channel width and current is more linear, which is more significant with larger current steps, and that the input and output admittances scale with current when the channel widths are scaled.

Using the construction shown in FIG. 1 smaller steps in channel area can be achieved by reducing the channel length l by one grid resolution unit over only a part of the channel width w.

FIG. 2 illustrates a refinement which can be used when at least one of the transistors can be divided into two or more narrower transistor segments connected in parallel. In the arrangement shown in FIG. 2 a unit change in width again gives a 10% current change but if instead one half is given a unit change in length a 2.5% current change is produced. This principle is limited by the minimum segment width but will, of course, allow smaller steps if more than two parallel transistors can be implemented.

A further possibility which enables a small increment in effective channel width and length is to have two or more parallel segments and to alter both the widths and lengths of each segment. Thus with the arrangement shown in FIG. 3 one of the segments $l_1$, $w_1$ is four units wide and twenty one units long while the other segment $l_2$, $w_2$ is nineteen units long and six units wide. This gives a 1% current step. Thus by allowing a 5% change in channel length the current step resolution has been increased by a factor of five. If the transistor can be divided into more than two narrower segments a further increase in current step resolution can be achieved using this principle.

While the examples show a channel length of twenty units and a channel width of ten units these dimensions are arbitrary and any convenient figures may be chosen for the width and length. It is, however, desirable that the channel length is such that a unit increase or decrease is only a small percentage of the nominal channel length and should preferably be kept below 10% thereof.

Using the example illustrated in FIG. 3 it can be seen that the invention allows current ratios in current mirror circuits using MOS transistors to be selected in 1% steps. Larger sized transistors would, of course, enable even small increments to be achieved while if coarser steps can be tolerated smaller devices may be usable. i.e. having dimensions which are a smaller number of grid resolution units.

From reading the present disclosure, other modifications will be apparent to persons skilled in the art. Such modifications may involve other features which are already known in the design and use of MOS transistors and which may be used instead of or in addition to features already described herein. Although claim have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A MOS transistor having a channel comprised of first and second segments connected in parallel, the first segment having a first width and a first length, and the second segment having a second width and a second length, wherein the first and second lengths are different, and the first and second widths are different.

2. The MOS transistor as set forth in claim 1, wherein the first and second lengths are each integer multiples of a prescribed minimum channel length.

3. The MOS transistor as set forth in claim 1, wherein the first and second widths are each integer multiples of a prescribed minimum channel width.

4. The MOS transistor as set forth in claim 2, wherein the first and second widths are each integer multiples of a prescribed minimum channel width.

* * * * *